(12) United States Patent
Panis

(10) Patent No.: US 6,981,192 B2
(45) Date of Patent: Dec. 27, 2005

(54) DESKEWED DIFFERENTIAL DETECTOR EMPLOYING ANALOG-TO-DIGITAL CONVERTER

(75) Inventor: Michael C. Panis, Brookline, MA (US)

(73) Assignee: Teradyne, Inc., Boston, MA (US)

( * ) Notice: Subject to any disclaimer, the term of this patent is extended or adjusted under 35 U.S.C. 154(b) by 580 days.

(21) Appl. No.: 10/256,586

(22) Filed: Sep. 27, 2002

(65) Prior Publication Data

US 2004/0064765 A1    Apr. 1, 2004

(51) Int. Cl.$^7$ .......................... G11B 20/20; G06F 11/00
(52) U.S. Cl. ...................... 714/740; 714/700
(58) Field of Search ............................... 714/700, 724, 714/740, 742; 327/100, 108; 702/120

(56) References Cited

U.S. PATENT DOCUMENTS

| | | | |
|---|---|---|---|
| 6,052,810 A * | 4/2000 | Creek | 714/740 |
| 6,057,716 A * | 5/2000 | Dinteman et al. | 327/108 |
| 6,281,699 B1 | 8/2001 | Bishop | 324/765 |
| 6,714,888 B2 * | 3/2004 | Mori et al. | 702/120 |

* cited by examiner

Primary Examiner—Shelly Chase
(74) Attorney, Agent, or Firm—Teradyne Legal Department

(57) ABSTRACT

A pin electronics circuit for automatic test equipment includes first and second sampling circuits for sampling first and second legs of a differential signal produced by a DUT (Device Under Test). Timing signals activate the first and second sampling circuits to sample the legs of the differential signal at precisely defined instants of time to produce first and second collections of samples. To deskew the legs of a differential signal with respect to each other, corresponding features within the first and second collections are identified and a difference is taken between them. The differential skew can then be applied to correct measurements of differential signals.

20 Claims, 3 Drawing Sheets

DESKEWED DIFFERENTIAL DETECTOR EMPLOYING ANALOG-TO-DIGITAL CONVERTER

CROSS-REFERENCES TO RELATED APPLICATIONS

Not Applicable.

STATEMENT REGARDING FEDERALLY SPONSORED RESEARCH OR DEVELOPMENT

Not Applicable.

REFERENCE TO MICROFICHE APPENDIX

Not Applicable

BACKGROUND OF THE INVENTION

1. Field of the Invention

This invention relates generally to detector circuits for automatic test equipment, and more particularly to detector circuits for receiving differential signals from a device under test (DUT).

2. Description of Related Art

Automatic test equipment (ATE) plays a significant role in the manufacture of semiconductor devices. Manufacturers generally use automatic test systems—or "testers"—to verify the operation of semiconductor devices at the wafer and packaged device stages of the semiconductor manufacturing process. By testing semiconductor devices at these stages, manufacturers are able to reject defective devices early, eliminating costs that would otherwise be incurred by processing defective parts. Manufacturers also use ATE to grade various specifications of devices. Devices can be tested and categorized according to performance in significant areas, for example, speed. Parts can then be labeled and sold according to their tested levels of performance.

FIG. 1 is a highly simplified schematic of a conventional tester 100. The tester 100 includes a host computer 118 that runs software for controlling various tests to be performed on a DUT 122. The software prescribes signal characteristics for applying stimuli to a DUT and for sampling responses from the DUT. A pattern generator (not shown) translates the signal characteristics into timing signals. Specialized circuits called pin electronics channels (110a–110e) then convert the timing signals into actual stimuli and timing windows.

The pin electronics channels provide a signal interface between the tester and the DUT. Each pin electronics channel typically includes a driver circuit 112, a detector circuit 114, and channel overhead circuitry 116. Each channel 110a–110e has an I/O terminal, respectively 120a–120e, which can be coupled to a node of the DUT 122. The channel overhead circuitry 116 typically includes DACs (digital-to-analog converters) for establishing drive levels of the driver circuit 112 and DACs for establishing detect levels of the detector circuit 114. It may also include timing formatters for adjusting the timing of drive edges and detect windows, and memory for storing digital patterns.

Testers use detector circuits for sampling signals generated by a DUT. Traditionally, detector circuits have been for sampling single-ended signals, i.e., for determining whether a single-ended signal is in a high logic state, a low logic state, or a logic state between high and low (a "between" state). Recently, detectors have also been used for sampling differential signals. In contrast with single-ended signals, which provide one signal for conveying a digital logic state with reference to a digital ground, differential signals convey digital logic states as differences between two signals, neither of which is digital ground. An example of a differential detector is presented in U.S. Pat. No. 6,281,699, entitled, "Detector With Common Mode Comparator For Automatic Test Equipment," which is hereby incorporated by reference in its entirety. As disclosed in that patent, a detector circuit includes a differential amplifier and a common mode amplifier. The differential amplifier produces a signal proportional to the difference between the two legs of an inputted differential signal, and the common mode amplifier produces a signal proportional to their average. The differential and common mode components of the differential signal can then be individually tested using window comparators.

Rapid advances in SerDes (Serializer/Deserializer) and SONET (Synchronous Optical Network) technologies have pushed differential signal speeds well above 1 GHz. Testing differential signals at these high speeds has posed new and difficult challenges for ATE manufacturers. In particular, it was once possible to rely upon careful fixture wiring to ensure that the delays of different legs of a differential signal were adequately matched, i.e., deskewed, with respect to each other. At data rates above 1 GHz, this is no longer the case. Even minute differences in the lengths or electrical characteristics of fixture wires or other parts of an ATE system can misalign the complementary edges of a differential signal. When these edges are misaligned, a differential amplifier within the tester that receives the differential signal produces edges that are artificially stretched in time, and a common mode amplifier produces signals having artificial spikes.

We have considered different approaches for correcting differential detector skew. For example, verniers (i.e., variable delay lines) can be positioned in series with the legs of a differential signal. The delays of the verniers can be adjusted so that the legs of the differential signal cross at precisely their 50% points. We have recognized that verniers suffer from certain drawbacks, however. For example, a vernier generally produces an output signal whose shape is different from the shape of its input signal. Changes in signal shape prevent a test system from accurately measuring certain characteristics of input signals, such as edge speeds and ringing.

What is needed is an accurate technique for deskewing differential signals received by a test system, which does not negatively impact the tester's ability to discern the analog characteristics of test signals.

BRIEF SUMMARY OF THE INVENTION

With the foregoing background in mind, it is an object of the invention to reduce timing skew between different legs of differential signals.

It is another object of the invention to preserve the analog characteristics of input signals from devices under test for examination by an automatic test system.

To achieve the foregoing object, as well as other objectives and advantages, electronics for automatic test equipment includes at least one sampling circuit for sampling first and second legs of a differential signal produced by a DUT. First and second timing signals activate the at least one sampling circuit respectively to sample the first and second legs of the differential signal at precisely defined instants of time to produce first and second collections of samples. To deskew the two legs of the differential signal with respect to each other, a first feature is identified in the first collection of samples, which generally corresponds to a signal edge of the first leg. A second feature is identified in the second collection of samples, which generally corresponds to a signal edge at the second leg. The differential skew is then computed as the time difference between the first and second features.

According to one embodiment of the invention, differential skew is corrected by varying a delay of at least one of the first and second timing signals to offset their timing with respect to each other by an amount equal to the measured skew. Differential voltages of differential signals can be computed as differences between corresponding samples in the first and second collections of data. Common mode voltages can be computed as mathematical averages of corresponding samples.

According to another embodiment of the invention, differential skew is corrected computationally by shifting the collection of samples for at least one of the first and second legs to effectively offset them by a number of samples that corresponds to the measured skew. Differential and common mode voltages can then be computed based upon the shifted samples.

BRIEF DESCRIPTION OF THE DRAWINGS

Additional objects, advantages, and novel features of the invention will become apparent from a consideration of the ensuing description and drawings, in which—

DETAILED DESCRIPTION OF THE PREFERRED EMBODIMENT

Figure 1:
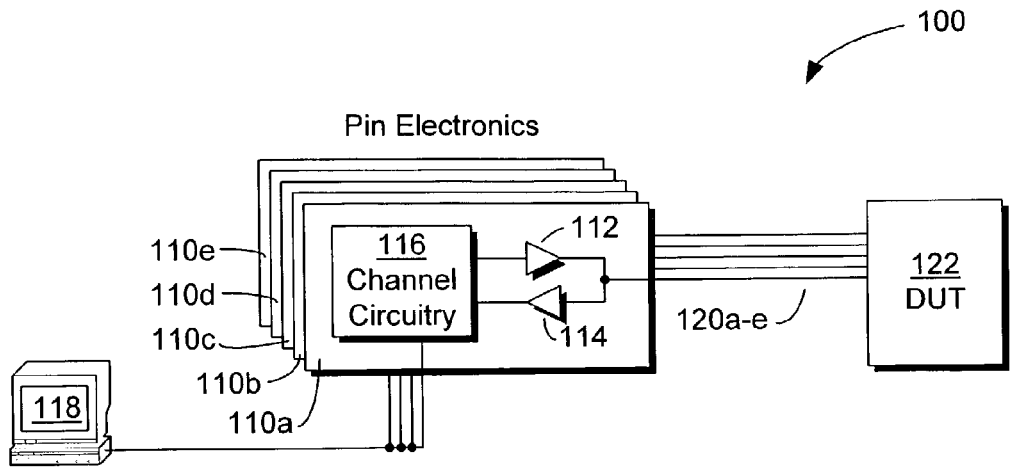
FIG. 1 is a simplified schematic of a conventional automatic test system including pin electronics channels for testing electronic devices.
Figure 2:
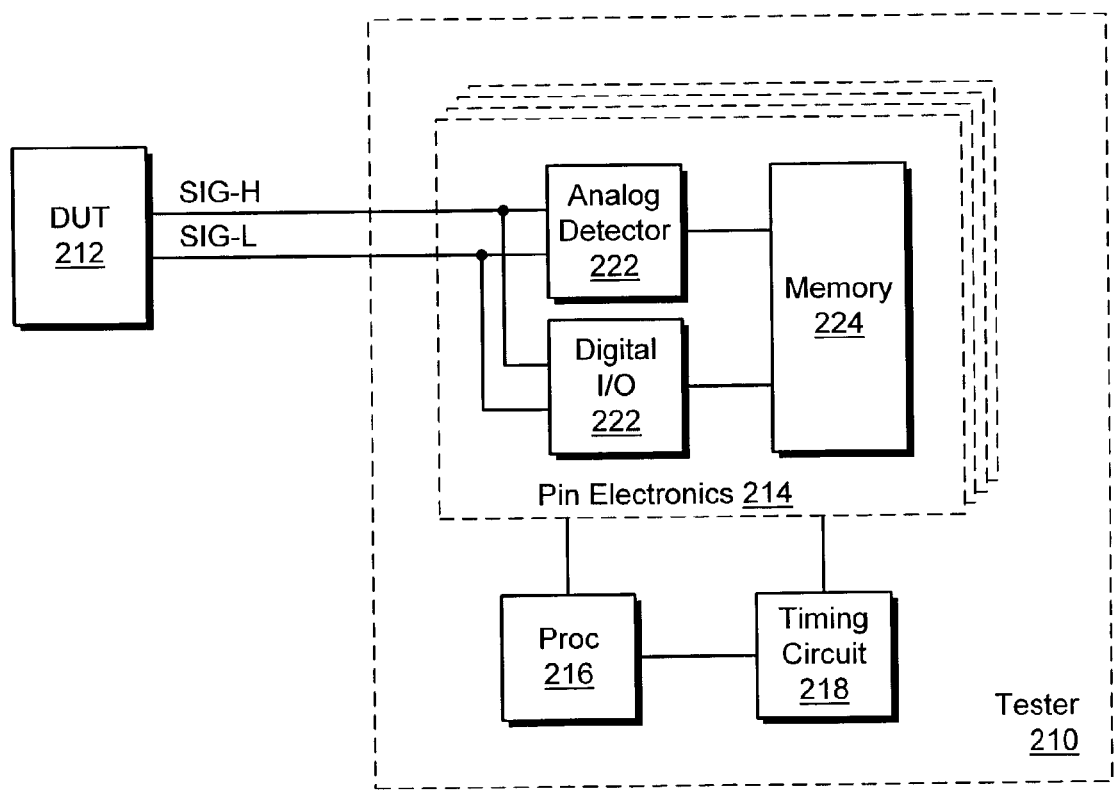
FIG. 2 is a simplified schematic of a test system including pin electronics channels according to an embodiment of the invention.

FIG. 2 shows a simplified block diagram of a tester 210 constructed in accordance with an embodiment of the invention. The tester 210 is arranged for testing differential signals produced by devices under test, such as DUT 212. An illustrative differential signal includes a first leg, SIG-H, and a second leg, SIG-L. The first and second legs of the differential signal vary in opposition with each other. The differential signal is conveyed to a pin electronics channel 214 within the tester, whereupon the signal is inputted to an analog detector 220. The analog detector includes circuitry for sampling each leg of the differential signal. The sampled signals are preferably stored as digital values in a memory 224.

Optionally, the pin electronics may also include digital I/O circuitry 222. The digital I/O circuitry may house conventional single-ended drivers and detectors. It may also include differential comparators and common-mode comparators, similar to those described in the above-referenced patent (U.S. Pat. No. 6,281,699). Drive states and detector values are also stored in the memory 224. Alternatively, they could be stored in a different memory.

The analog detector 220 and the digital I/O 222 operate under strict timing control of a timing circuit 218. One timing circuit may be shared among different channels. Alternatively, different timing circuits can be provided for different channels, to increase timing flexibility. The timing circuit 218 generates timing signals that change state at precisely defined instants of time. The digital I/O 222 uses the timing signals to produce precisely placed drive edges, and to sample detected signals at precisely known instants. The analog detector 220 uses these edges to time the sampling of one or both legs of the differential signal.

A processor 216 controls the activities of the timing circuit 218 and the pin electronics circuit 214. The processor preferably includes a CPU, memory, and software for conducting tests of the DUT 212, for calibrating the tester 210, and for applying calibration results to correct measured values.

Figure 3:
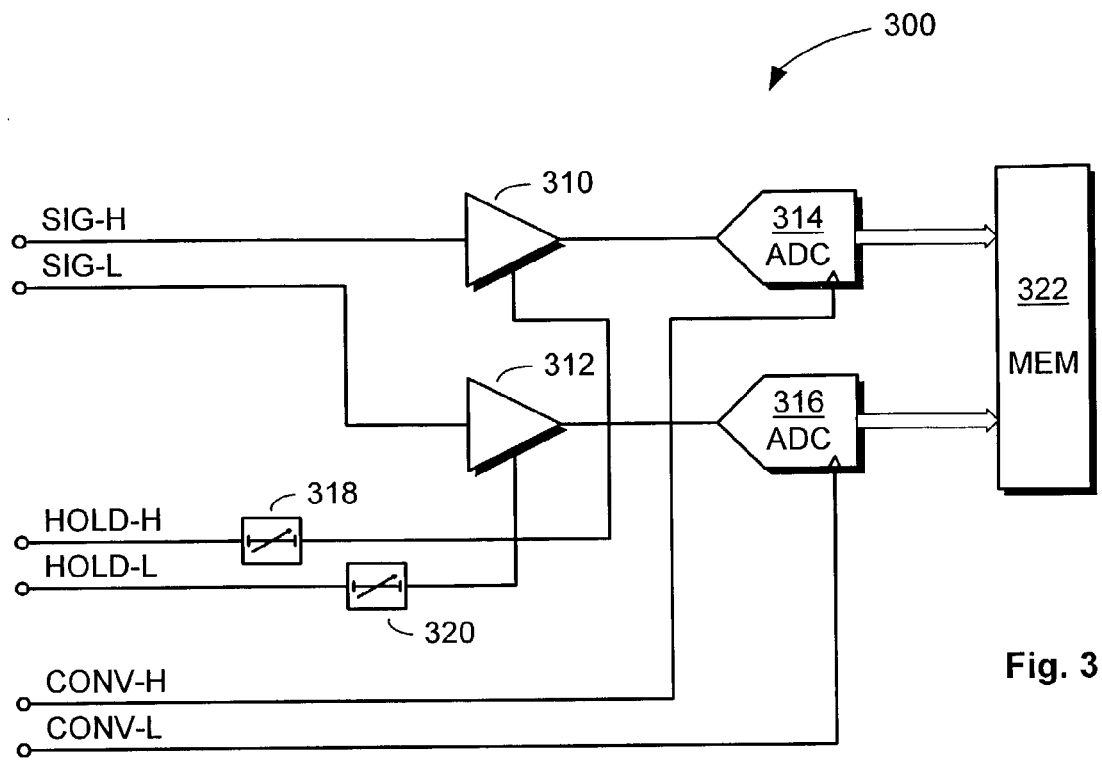
FIG. 3 is a simplified schematic of an embodiment of the analog detector circuit of FIG. 2.

FIG. 3 shows a first embodiment 300 of the analog detector 220. A first holding circuit 310 receives the first leg, SIG-H, of the differential signal, and a second holding circuit 312 receives the second leg, SIG-L. The holding circuits 310 and 312 are preferably track-and-hold amplifiers, although they can also be sample-and-hold amplifiers or similar circuits for selectively holding representations of their time-varying analog inputs steady at their analog outputs. The holding circuits each have a control input for receiving a timing signal from the timing circuit 218. The first holding circuit 310 receives a first timing signal, HOLD-H, and the second holding circuit 312 receives a second timing signal, HOLD-L. For each of the first and second holding circuits, a signal edge on its respective timing signal causes the holding circuit to change from a tracking mode to a holding mode. In tracking mode, the output of the respective holding circuit follows or "tracks" changes in its input, and thus behaves like a conventional linear amplifier. In holding mode, the signal outputted by the respective holding circuit abruptly stops changing and holds the value it had when the respective timing signal changed state.

The outputs of the first and second holding circuits 310 and 312 respectively feed inputs of first and second ADCs (analog-to-digital converters) 314 and 316. The ADCs convert analog signals at their inputs to digital values, which are stored in a memory 322. This memory may be a portion of the memory 224, or it may be a separate memory. Timing signals CONV-H and CONV-L direct the ADCs 314 and 316 to convert their analog input signals. For accuracy, CONV-H and CONV-L are preferably activated a fixed time after the issuance of the corresponding hold signals, HOLD-H and HOLD-L, respectively. This is not critical, however. Once the holding circuits are made to hold their respective signals, there is a range of time over which the corresponding ADC may accurately convert its value. Preferably, the timing circuit 218 is used to generate CONV-H and CONV-L. Alternatively, these signals could be provided locally, based on delayed versions of HOLD-H and HOLD-L.

In the preferred embodiment, the timing of the first and second timing signals HOLD-H and HOLD-L can be varied via the action of programmable delay circuits 318 and 320. Preferably, these delay circuits are provided locally within each analog detector 300, for individually adjusting the timing of HOLD-H and HOLD-L. Alternatively, the programmable delay circuits can be incorporated within the timing circuit 218. It should also be understood that while two timing signals (HOLD-H and HOLD-L) provide a great deal of flexibility, the two signals need not be unique. For the purposes of the invention, they could be derived from the same signal or could be the same physical signal.

Figure 4:
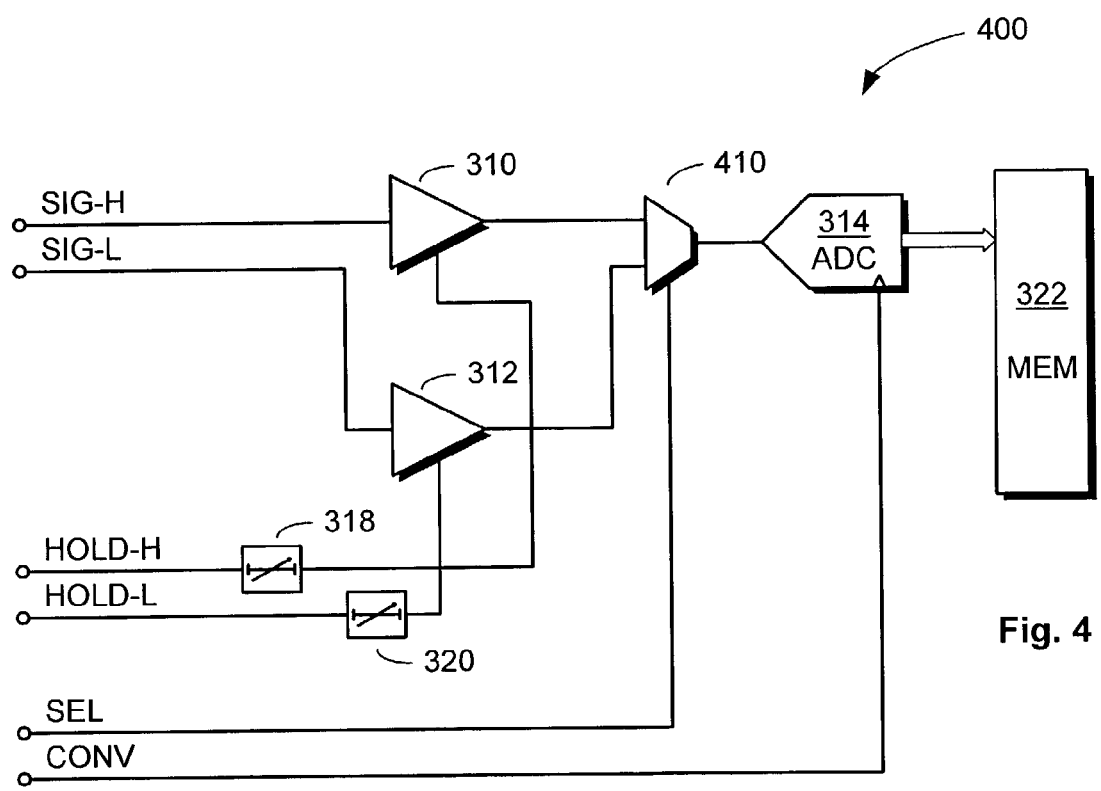
FIG. 4 is a simplified schematic of an alternative embodiment of the analog detector circuit of FIG. 2.

FIG. 4 shows a second embodiment 400 of the analog detector 220. This embodiment requires only one ADC (314), but achieves functionality similar to the first embodiment 300 by switching the outputs of holding circuits 310 and 312 to the input of the ADC 314 via an analog multiplexor 410. Because the timing of the ADC's conversion is not strictly critical, the ADC 314 can be used to alternately convert signals from the first and second holding circuits, while constructing a record in memory that is substantially identical to that produced in the embodiment of FIG. 3.

Under control of the processor 216 and the timing circuit 218, the analog detector 220 can be made to sample each leg of a differential signal at precisely defined instants of time. In the preferred embodiment, the analog detector 220 samples the legs of the differential signal using a technique conventionally known as "undersampling." The tester operates this undersampling technique by repetitively stimulating the DUT to output the differential signal, for example, periodically, and causing the analog detector to sample the differential signal a known delay after the beginning of each cycle. The delay is varied to capture the legs of the differential signal at different moments. For example, the positions of the HOLD-H and HOLD-L signals can be varied in regular increments each cycle, to provide digital representations of the first and second legs as discrete functions of time. Except for the fact that the positions of HOLD-H and HOLD-L are varied, every cycle is substantially identical to every other cycle. Therefore, the accumulated discrete samples representing the legs of the differential signal closely resemble the actual signals as they occur in time.

Figure 5:
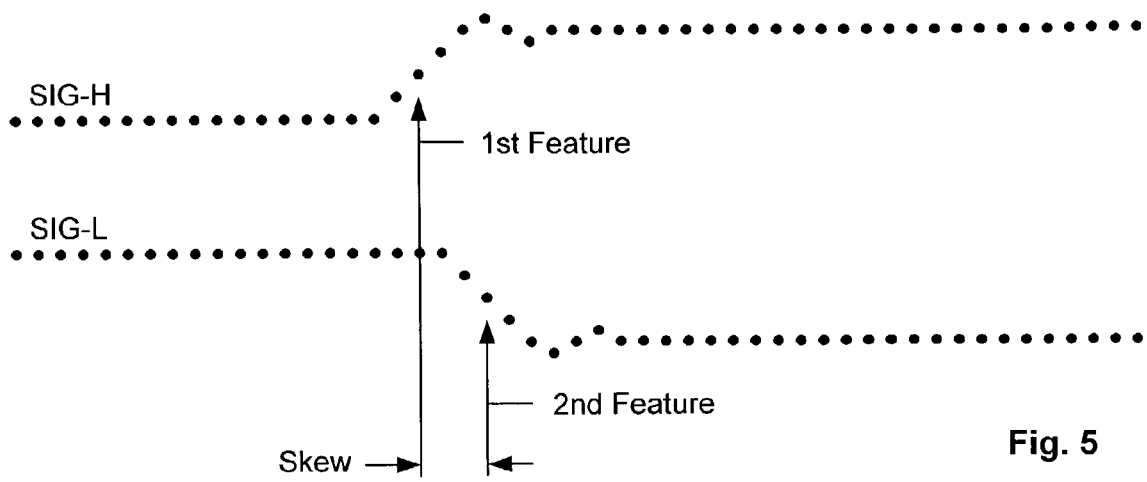
FIG. 5 is an illustration of discretely sampled values representing first and second legs of a differential signal captured by the analog detector circuit of FIG. 2.

FIG. 5 shows a graphical representation of a range of samples of SIG-H and a range of samples of SIG-L. These ranges correspond to the same interval of time. During this interval, SIG-H makes a transition from low to hi, and SIG-L makes a transition from hi to low. Ideally, in the absence of differential skew, SIG-H would go high at precisely the same time that SIG-L goes low. But because there is skew, these edges do not perfectly coincide.

Figure 6:
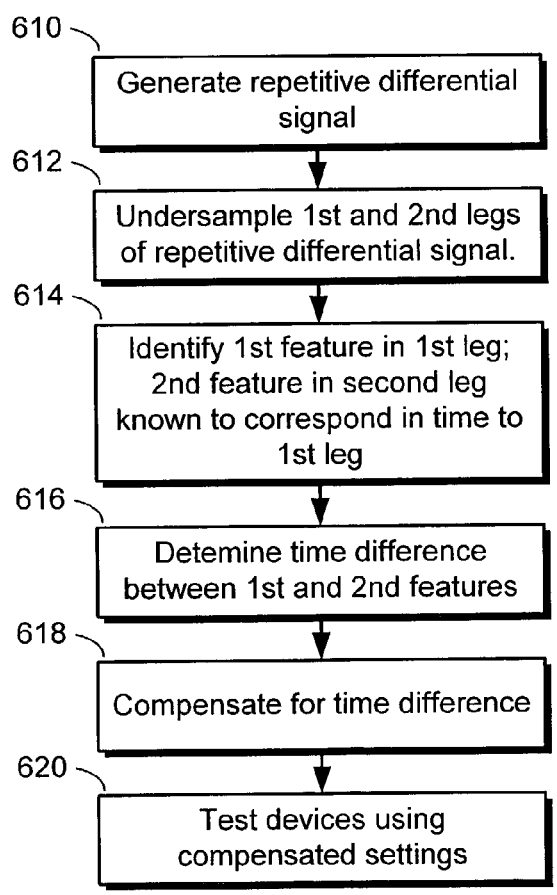
FIG. 6 is a flowchart of a process for deskewing differential signals according to an embodiment of the invention.

FIG. 6 shows a flowchart of a process according to the invention for measuring and compensating for differential skew. At step 610, a tester repetitively generates a differential signal, as described above. Ideally, this differential signal should have zero differential skew, so that its legs cross at precisely their 50% points. If no "golden standard" is available, however, any differential signal can be used, provided its actual differential skew is precisely known.

At step 612, the tester controls the analog detector 220 for undersampling the first and second legs (SIG-H and SIG-L) of the differential signal. As a result of this step, a first collection of sampled data is stored in memory for the first leg-H, and a second collection of sampled data is stored in memory for the second leg.

At step 614, first and second features are identified in the first and second collections of sampled data. These features are shown in FIG. 5 and are preferably the 50% points of the edges of SIG-H and SIG-L. These features correspond to points in the waveforms that would ideally coincide if the differential signal had no differential skew. Other features could be used besides the 50% points, for example, the "knees" at which the signals at the first and second legs first begin to change.

With the first and second features identified, skew can be ascertained as the time difference between them (see step 616). Once the differential skew is known, it can be compensated to allow the tester to make accurate measurements (see step 618).

One way to compensate for differential skew is to align the sampled data computationally. Using the sampled data of FIG. 5 as an example, we see that the second feature occurs four samples after the first feature. To correct subsequent measurements, samples of SIG-H could be advanced (i.e., moved to the right) by four sample intervals, for example by changing a pointer in memory. This would allow point-for-point comparisons between the first and second collections of data. With the corrections made, the difference between the collections can be taken to produce the differential voltage of the differential signal, and the average can be taken to produce the common mode voltage.

If the length of the sampling interval falls below the timing resolution needed for accurate deskewing, precision can be further improved by interpolating between samples to determine the 50% points more precisely. For instance, the edge of each leg can be separately analyzed to identify a sample just above the 50% point and a sample just below the 50% point. A line or other estimating function can then be constructed between these points, and the precise time at which the 50% point lies on the constructed function can be determined. Comparisons can be made between the legs of the differential signal using interpolated data. Another way to compensate differential skew is to program one or both of the programmable delay circuits 318 and 320 so that the difference in their delays equals the measured skew. This technique offsets the times at which the holding circuits 310 and 312 switch from track to hold and effectively cancels skew in the resulting collections of data. During actual testing, difference can be taken on a point-for-point basis to produce the differential voltage and their average can be taken to yield the common mode voltage. Based on the requirements of the application, this technique can also be combined with the computational technique described above. Once the differential skew has been compensated, devices can be tested with the compensated settings to yield more accurate results (see step 620).

In addition to its role in deskewing differential signals, the analog detector 220 can also be used to promote accurate measurements of analog signals.

Conventional detector circuits employ comparators for measuring input signals. We have found that these comparators often lack sensitivity to small voltage changes, particularly changes that occur near the comparators' threshold voltages. The holding circuits 310 and 312 tend to be more sensitive than comparators to small voltage changes, and are believed to produce more accurate measurements.

While the invention has been particularly shown and described with reference to the preferred embodiments thereof, it will be understood by those skilled in the art that various changes in form and detail may be made therein without departing from the spirit and scope of the invention.

What is claimed is:

1. An automatic test system for testing a device under test (DUT), comprising:
   at least one sampling circuit connectable to the DUT for receiving first and second legs of a differential signal and for sampling said first and second legs at predetermined instants of time defined by first and second timing signals, respectively,
   at least one memory for storing samples acquired by the at least one sampling circuit;

first and second variable delay circuits for respectively delaying the first and second timing signals enroute to the at least one sampling circuit; and a processor, coupled to the at least one memory and to the first and second variable delay circuits, for comparing samples of the first and second legs of the differential signal to identify a differential skew therebetween, for establishing delays of the first and second variable delay circuits, and for substantially correcting for the effects of the differential skew.

2. An automatic test system as recited in claim 1, wherein the at least one sampling circuit comprises:

a first ADC;

a second ADC;

a first holding circuit having an input connectable to the DUT for receiving the first leg of the differential signal, an output coupled to the first ADC, and a control input for receiving the first timing signal;

a second holding circuit having an input connectable to the DUT for receiving the second leg of the differential signal, an output coupled to the second ADC, and a control input for receiving the second timing signal.

3. An automatic test system as recited in claim 2, wherein the at least one sampling circuit is provided within a pin electronics channel of the automatic test equipment, and further comprising a plurality of additional pin electronics channels substantially similar to the pin electronics channel.

4. An automatic test system as recited in claim 1, wherein the at least one sampling circuit comprises a single ADC, and each of the plurality of electronic circuits further comprises:

a multiplexor having a first input connectable to the DUT for receiving the first leg of the differential signal, a second input connectable to the DUT for receiving the second leg of the differential signal, an output coupled to an input of the ADC, and a control node for selecting either the signal at the first input or the signal at the second input for passage to the output of the multiplexor.

5. An automatic test system as recited in claim 4, further comprising:

a first analog holding circuit having an input connectable to a node of the DUT for receiving the first leg of the differential signal, an output coupled to the first input of the multiplexor, and a control input for receiving the first timing signal; and a second analog holding circuit having an input connectable to a node of the DUT for receiving the second leg of the differential signal, an output coupled to the second input of the multiplexor, and a control input for receiving the second timing signal.

6. An automatic test system as recited in claim 1, wherein the processor corrects for the effects of the differential skew by establishing a compensating delay of at least one of the first and second variable delay circuits.

7. An automatic test system as recited in claim 1, wherein the processor corrects for the effects of the differential skew by shifting samples corresponding to at least one of the first and second legs by a number of samples corresponding in time to the differential skew between the first and second legs.

8. A pin electronics circuit for an automatic test system for testing a device under test (DUT), comprising:

at least one analog holding circuit connectable to the DUT for receiving first and second legs of a differential signal and for sampling said first and second legs at predetermined instants of time respectively defined by first and second timing signals; and at least one ADC having an input coupled to the at least one analog holding circuit for converting analog signals to digital values, and an output connectable to at least one memory for storing said digital values, wherein the first and second timing signals are each variable for sampling said first and second legs of the differential signal at different instants of time, and wherein digital values stored in the memory are accessible by a processor for determining a differential skew between the first and second legs of the differential signal.

9. A pin electronics circuit as recited in claim 8, wherein the at least one holding circuit comprises a first analog holding circuit having an input for receiving the first leg of the differential signal and a second analog holding circuit having an input for receiving the second leg of the differential signal.

10. A pin electronics circuit as recited in claim 9, wherein the at least one ADC comprises a first ADC coupled to the first analog holding circuit and a second ADC coupled to the second analog holding circuit.

11. In an automatic test system, a method of deskewing first and second legs of a repetitive, differential signal received by the automatic test system from a DUT (device under test), comprising:

undersampling each of the first and second legs of the differential signal to generate first and second collections of sampled data;

analyzing the first and second collections of sampled data to identify a first feature within the first collection of sampled data and a second feature within the second collection of sampled data that corresponds in time to the first feature; and determining the skew between the first and second legs of the differential signal as the time difference between the first and second features.

12. A method as recited in claim 11, wherein the first feature is a first edge corresponding to a change of state of the first leg of the differential signal and the second feature is a second edge corresponding to a change of state in the second leg of the differential signal.

13. A method as recited in claim 12, wherein the first feature is a substantially 50% point of the first edge, and the second feature is a substantially 50% point of the second edge.

14. A method as recited in claim 11, further comprising applying the determined skew for correcting skew in measurements of the differential signal.

15. A method of manufacturing integrated circuits, comprising:

connecting an automatic test system to nodes of an integrated circuit, the automatic test system including a plurality of electronic circuits for receiving differential signals produced by the integrated circuit;

undersampling, by at least one of the plurality of electronic circuits, first and second legs of a differential signal produced by the integrated circuit, to generate first and second collections of sampled data;

analyzing the first and second collections of sampled data to determine a differential skew between the first and second legs of the differential signal;

correcting for the differential skew in measurements of the differential signal; and determining a testing status of the integrated circuit in response to a corrected measurement of the differential signal.

16. A method as recited in claim 15, wherein the step of analyzing comprises:

identifying a first feature within the first collection of sampled data;

identifying a second feature within the second collection of sampled data that corresponds in time to the first feature; and determining the skew between the first and second legs of the differential signal as the time difference between the first and second features.

17. A method as recited in claim 16, wherein the first feature is a first edge corresponding to a change of state of the first leg of the differential signal and the second feature is a second edge corresponding to a change of state in the second leg of the differential signal.

18. A method as recited in claim 15, wherein the testing status is one of a passing test result and a failing test result.

19. A method as recited in claim 18, further comprising discarding integrated circuits producing a failing result.

20. A method as recited in claim 15, further comprising grading integrated circuits based upon the determined test status.

* * * * *